United States Patent [19]
Liao et al.

[11] Patent Number: 6,027,953
[45] Date of Patent: Feb. 22, 2000

[54] LATERAL PN ARRAYED DIGITAL X-RAY IMAGE SENSOR

[75] Inventors: Chungpin Liao, Taichung; Jen-chau Wu, Hsin-chu, both of Taiwan

[73] Assignee: Industrial Technology Research Institute, Hsin-Chu, Taiwan

[21] Appl. No.: 09/030,196

[22] Filed: Feb. 25, 1998

[51] Int. Cl.[7] .................................................. H01L 21/00
[52] U.S. Cl. ............................................. 438/36; 438/512
[58] Field of Search ......................... 438/512, DIG. 165, 438/36

[56] References Cited

U.S. PATENT DOCUMENTS

| | | |
|---|---|---|
| 4,700,076 | 10/1987 | Dorman et al. . |
| 5,079,426 | 1/1992 | Antonuk et al. .................... 250/370.09 |
| 5,237,197 | 8/1993 | Snoeys et al. ........................... 257/458 |
| 5,510,644 | 4/1996 | Harris et al. . |
| 5,569,938 | 10/1996 | Shoda et al. . |
| 5,652,430 | 7/1997 | Lee .................................... 250/370.09 |
| 5,798,558 | 8/1998 | Tyson et al. . |

OTHER PUBLICATIONS

Klahr et al., Neuton Transmutations Dope Semiconductors, McGraw–Hill, pp. 1–4 or 62–65, Apr. 1964.

S. Purssin et al., Applications of Neutron Transmutation doping for Production of homogneous epi–layers, J. Electrochem. Soc., pp. 350–352, Feb. 1978.

Young et al., Electrical properties of neutron transmutation doped polycrystalline silicon, IEEE, pp. 65–67, 1976.

S. Wolf and R.N. Tauber, Silicon Processing for the VLSI Era, V1., pp. 26–28, 1986.

*Primary Examiner*—Charles Bowers
*Assistant Examiner*—Scott J. Hawranek
*Attorney, Agent, or Firm*—George O. Saile; Stephen B. Ackerman

[57] ABSTRACT

An X-ray imaging array is described together with a method for its manufacture. The array is defined by a set of PN junctions in a silicon wafer that extend all the way through between the two surfaces of the wafer. The PN junctions are formed using neutron transmutation doping that is applied to P-type silicon through a mask, resulting in an array of N-type regions (that act as pixels) in a sea of P-type material. Through suitable placement of the biassing electrodes, a space charge region is formed that is narrower at the top surface, where X-rays enter the device, and wider at the lower surface. This ensures that most of the secondary electrons, generated by the X-ray as it passes through the wafer, get collected at the lower surface where they are passed to a charge readout circuit.

9 Claims, 2 Drawing Sheets

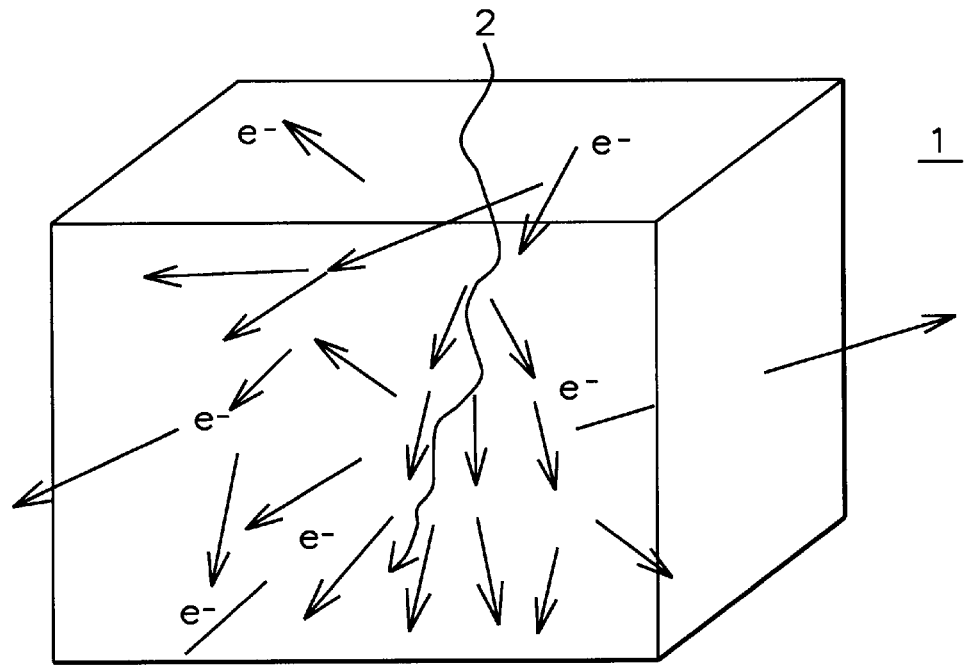
FIG. 1 - Prior Art
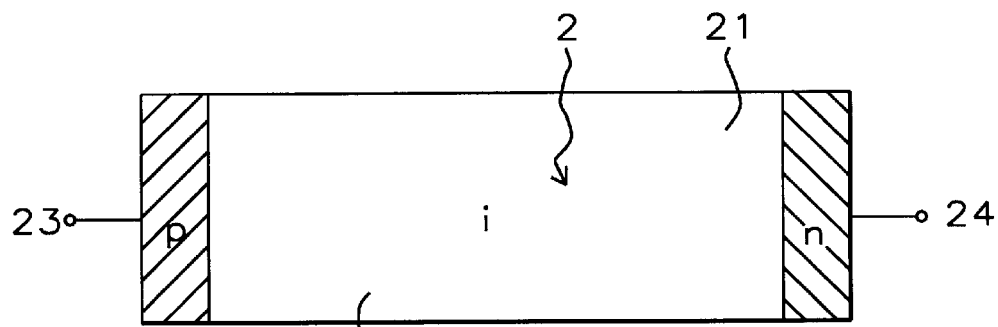
FIG. 2 - Prior Art
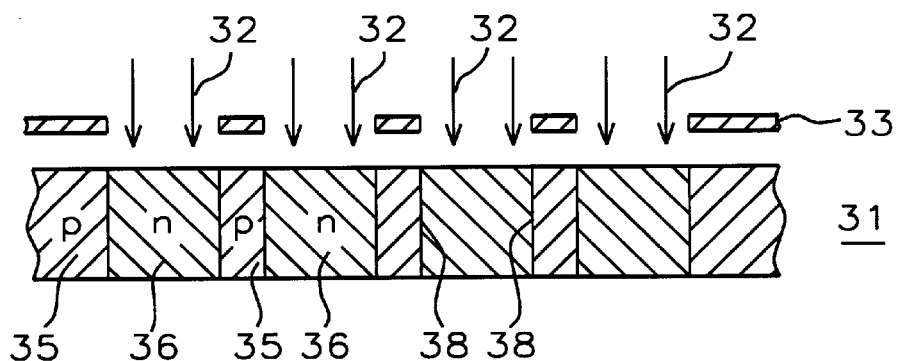
FIG. 3

LATERAL PN ARRAYED DIGITAL X-RAY IMAGE SENSOR

FIELD OF THE INVENTION

The invention relates to the general field of X-ray detection by solid state devices with particular reference to the formation of real time X-ray images.

BACKGROUND OF THE INVENTION

Ever since the emergence of high tech. solid state technology, attempts have been made to develop high resolution, low dosage X-ray imaging devices. Ideally, such a device would allow a high resolution image to be viewed in real time at a location well removed from the X-ray source while at the same time subjecting the object (or person) under scrutiny to a relatively low dose of X-radiation.

In FIG. 1 we illustrate what happens when a quantum of X-radiation 2 enters a solid material 1 such as a crystal of silicon or germanium. The X-ray will gradually dissipate over a distance proportional to its energy. The energy dissipated per unit length is referred to as the stopping power of the material, being 1.6 keV/micron for silicon and 3.2 keV/micron for germanium. Thus the range of 100 keV X-rays is about 60 microns in silicon and about 30 microns in germanium.

Two mechanisms are involved in dissipating the X-ray. First is the Compton effect which is a momentum exchange between the quantum and a free electron in the solid resulting in an increase in wavelength for the former and an increase in energy for the latter. Second is the photoelectric effect which is the ejection of an inner shell electron converting it, at least temporarily, to a free electron. The net effect of the two mechanisms combined is to temporarily increase the conductivity of the irradiated material in a region immediately surrounding the trajectory of the X-ray. The higher the stopping power of the detector material the smaller the volume of this region.

This effect of the X-radiation is the basis for a typical X-ray detector of the prior art such as the one shown in schematic form in FIG. 2. Block 21 of silicon or germanium is divided into three parts. In the center is the detecting region 22 which is of intrinsic material (typically formed through lithium doping), while the two ends that connect to leads 23 and 24 are of P and N type material. In the absence of X-radiation 2 the resistance between 23 and 24 is very high (so there is negligible leakage current) both because of the intrinsic resistivity of 22 and because of the opposite conductivity types at the ends. Once radiation is applied to 21, large numbers of electrons and holes are formed and the resistance between 23 and 24 drops so that a substantial leakage current can be measured.

The main disadvantage of this type of detector is that a relatively large(volume of semiconductor material, of the order of 10 cc., is required for adequate sensitivity. If smaller volumes are used, only some of the electrons formed in the wake of the X-ray will be available for collection and sensitivity is reduced. Thus detectors of this type are unsuitable for use in imagers as they provide poor resolution.

Because of its complete compatibilty with integrated circuits, silicon would be the preferred choice for an X-ray imager but, as discussed above, its low stopping power prevents good pixellation, at least with the PiN structures known to the prior art. Germanium has a larger stopping power for X-rays but it is still relatively small and, also, the intrinsic resistivity of germanium at room temperature is quite low (about 50 ohm-cm.). An example of a material that has large stopping power is cadmium zinc telluride (CZT) but this material is not available in crystalline form. This results in low carrier mobility and short minority carrier lifetime, leading to poor signal/noise ratio and slow response time. Similar problems apply to mercury iodide which suffers from the additional serious drawback of being extremely soft.

Because of the difficulties discussed above, the number of X-ray imager designs described in the prior art is quite small. References that we have found to be of interest include Antonuk et al. (U.S. Pat. No. 5,079,426 January 1992) who describe an array of photoconductors made of hydrogenated amorphous silicon. Snoeys et al. (U.S. Pat. No. 5,237,197 August 1993) describe an array of PIN diodes which are biassed to collect charge generated by ionizing radiation. The junctions are parallel to the wafer surface so occupy a fair amount of space. Lee (U.S. Pat. No. 5,652,430 July 1997) describes a structure that also uses a photocondcutor as the transducer. A charge accumulating capacitor is included with each detecting element for periodic discharge into a display.

SUMMARY OF THE INVENTION

It has been an object of the present invention to provide a device for imaging an X-ray beam.

A further object has been that said device have high resolution, high sensitivity, low cost, and operate in real time.

A still further object has been that the device be compatible with integrated circuits and their packages.

Yet another object has been to provide a method for manufacturing the device.

These objects have been achieved by forming PN junctions in a silicon wafer, said junctions extending all the way through between the two surfaces of the wafer. The PN junctions are formed using neutron transmutation doping that is applied to P-type silicon through a mask, resulting in an array of N-type regions (that act as pixels) in a sea of P-type material. Through suitable placement of the biassing electrodes, a space charge region is formed that is narrower at the top surface, where X-rays enter the device, and wider at the lower surface. This ensures that most of the secondary electrons, generated by the X-ray as it passes through the wafer, get collected at the lower surface where they are passed to a charge readout circuit.

BRIEF DESCRIPTION OF THE DRAWINGS

FIG. 1 illustrates the progress of an X-ray quantum through a block of semiconducting material.

FIG. 2 illustrates the PiN cell used in the prior art for the detection of X-rays.

FIG. 3 is a schematic cross-section of an X-ray imager based on the present invention, also illustrating how such a device is manufactured.

DESCRIPTION OF THE PREFERRED EMBODIMENTS

Figure 4:
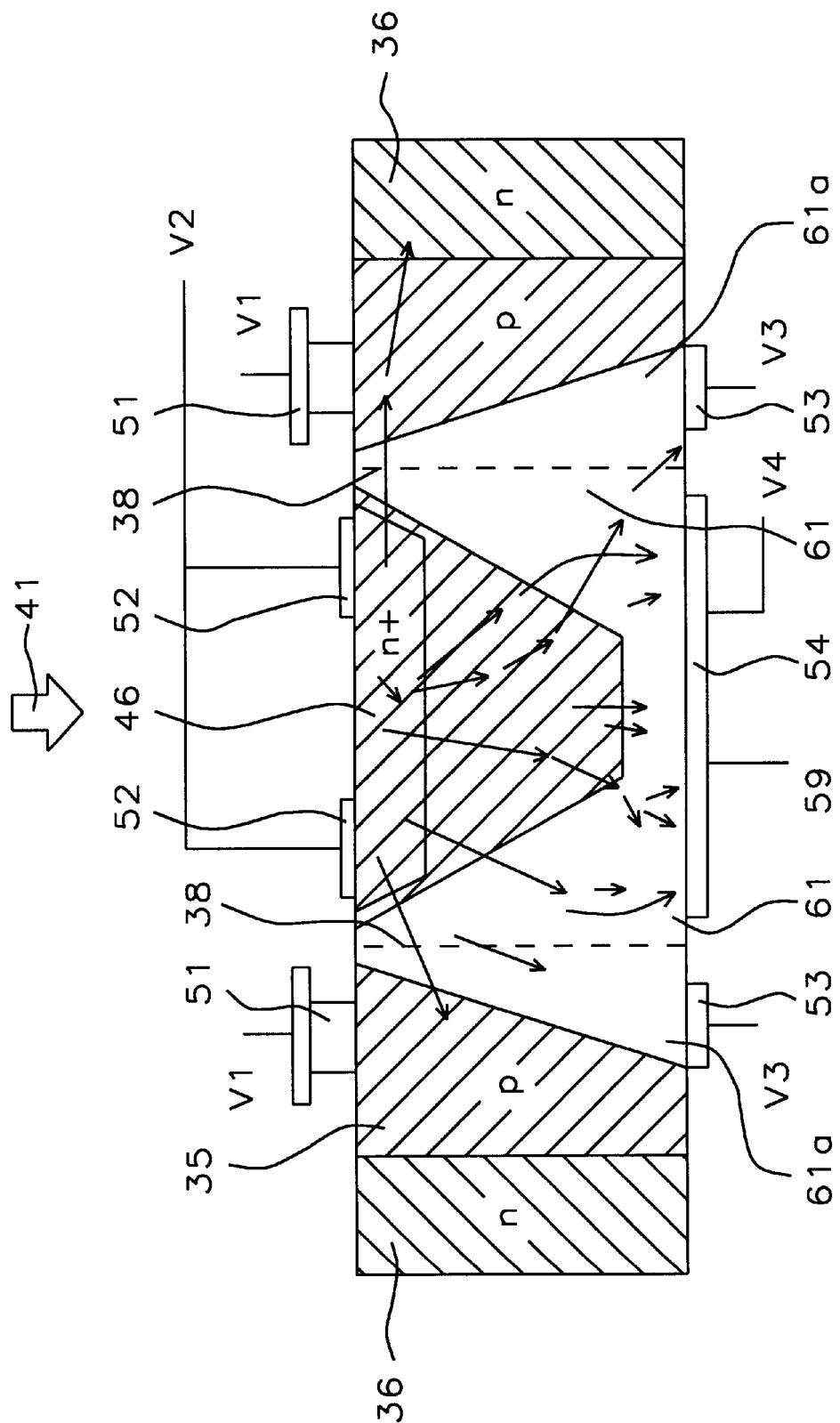
FIG. 4 shows the basic operating principle of the device of the present invention.

FIG. 3 illustrates both the main features of the device disclosed in the present invention as well as the process that is used to form it. P-type silicon wafer 31 (between about 0.2 and 1.5 mm. thick, between about 10 and 30 cm. in diameter, and having a resistivity between about 40 and 150 ohm-cm.) has been subjected to bombardment by thermal (slow) neutrons (symbolized by arrows 32) through mask 33. The latter was made from a material with good neutron attenuation characteristics such as gadolinium or cadmium or their alloys and is between about 2 and 10 microns thick.

As a consequence of neutron transmutation doping (NTD), those portions of wafer 31 not protected by the mask were converted to N-type silicon (with resistivity between about 20 and 100 ohm-cm.) which extended all the way through the wafer from surface to surface.

The NTD process is based on the fact that, although silicon has an atomic number of 14 and an atomic weight of 28, naturally occurring silicon is not entirely made up of the $Si^{28}$ isotope. It turns out that $Si^{29}$ is present at a concentration of about 4.7 atomic % and $Si^{30}$ is present at a concentration of about 3.1 atomic %. Additionally, it turns out that $Si^{30}$, when bombarded by thermal neutrons, is transmuted to phosphorus $P^{31}$ (atomic number 15). Since the desired level of phosphorus doping is well below the 3.1 at. % of the already present $Si^{30}$, it is apparent that a limited amount of neutron bombardment of naturally occurring silicon, will result in the introduction of phosphorus dopant into the silicon. Such phosphorus dopant will be uniformly distributed and will also be in substitutional position in the lattice where it can act as a donor.

Details of the NTD process used in this instance are as follows: a neutron fluence of between about $1\times10^{18}$ and $5\times10^{18}$ neutrons/cm.$^2$ which can preferably be accomplished by a flux of between about $10^{13}$ and $10^{14}$ neutrons/cm.$^2$sec. The period of time over which NTD was carried out was between about 3 hours and 5 days.

The areas converted to N-type by the NTD were defined by the openings in mask 33. These openings were generally square but; other shapes, such as circles, could also have been used. The linear dimension (square side, circle diameter, etc.) of the openings was between about 40 and 100 microns and their area was between about 1,600 and 10,000 sq. microns. The distance between openings was between about 10 and 30 microns, corresponding to an array density of between about 6,000 and 40,000 pixels/sq. cm. made up of N-type areas surrounded by P-type material.

Referring now to FIG. 4, we illustrate the operation of a single pixel of the display. We note first that X-rays (symbolized by arrow 41) enter from the top (or near) side. Each pixel has four sets of contacts to which different voltages will be applied. The contacts 51 connect to the P region immediately adjacent to the pixel and are connected to voltage V1. Contacts 52 connect to N+ region 46 which was separately formed using either ion implantation or chemical diffusion. Contacts 52 are connected to voltage V2 and are located close to PN junction 38.

Typical values for V1 and V2 are −200 and −100 volts, respectively.

Contacts 53 are on the far side of P region 35 but are located close to the PN junction 38 (for reasons that will be explained below). They are connected to voltage V3. Contact 54 covers most of the far side of the pixel and is connected to voltage V4.

Typical voltages for V3 and V4 are +50 and +100 volts, respectively.

Output line 59 runs from contact 54 to a suitable charge readout circuit such as, for example, existing circuitry from a charge coupled device (CCD). The pixel is activated when all four voltages V1–V4 are in place. As a result of the voltage differences between V1 and V4, the PN junctions 38 are reverse biassed and a depletion or space charge region (SCR) 61 is established. The application of V3 at contact 53 causes the SCR to be extended to include volume 61a while the application of V2 at contacts 52 pulls the SCR in towards the PN junction 38.

Thus, through the above described placement of the various biassing contacts, together with the voltages applied to them, a SCR is formed that is narrower at the near end, where X-rays enter the display, and wider at the far end. An X-ray quantum starting its journey at the center of the pixel encounters a high density of free electrons thereby increasing the probability of forming Compton effect electrons. As these progress, together with the original quantum (now reduced in energy), they enter the SCR inside which all but the highest energy (>300 V) electrons are channeled towards electrode 59. Since the electron density is highest near the far side of the pixel, the widening there of the SCR increases the probability that they will lose sufficient energy to be retained within the SCR before they reach its edge. In a conventional X-ray detector of the prior art this had to be achieved by means of the large intrinsic region.

This completes the description of the device, and the process for manufacturing it, except to note that the device, as described, is well suited for incorporation within a standard integrated circuit package. For example, contacts 51 and 52 could take the form of solder bumps so that the chip or wafer could be mounted using flip chip technology while contacts 53 and 54 could be accessed using wire bonding technology.

The design of the present invention has a collection efficiency (for 100 keV X-ray induced electrons) of about 2% for a 500 micron thick detector. This corresponds to the collection of about 100 electrons per incident photon or $10^6$ electrons by a 40×40 micron pixel irradiated with 100 keV X-rays at an intensity of $10^4$ photons per pixel.

While the invention has been particularly shown and described with reference to the preferred embodiments thereof, it will be understood by those skilled in the art that various changes in for if and details may be made without departing from the spirit and scope of the invention.

What is claimed is:

1. A process for forming an X-ray imaging device, comprising:

providing a wafer of P-type silicon having an upper and a lower surface;

through a mask having an array of openings, bombarding the wafer with properly aligned thermal neutrons for a period of time, thereby converting to N-type all silicon located below said openings and thereby forming an array of P-type regions surrounded by N-type material;

wholly within each P-type region, forming an N+ region that extends downwards from said upper surface;

on the upper surface, wholly with each of said regions of N+ silicon, forming first negatively biased contacts;

on the upper surface, wholly within each of the P-type regions and outside the N+ regions, forming second negatively biased contacts more positive than the first negatively biased contacts on the lower surface, centrally located within each P-type region and underlying each region of N+ silicon, forming first positively biased contacts; and on the lower surface, underlying the second negatively biased contacts, forming second positively biased contacts more negative than the first positively biased contacts.

2. The process of claim 1 wherein the wafer has a thickness between about 0.2 and 1.5 mm.

3. The process of claim 1 wherein each of said openings has an area between about 1,600 and 10,000 sq. microns.

4. The process of claim 1 wherein the openings are between about 10 and 30 microns apart.

5. The process of claim 1 wherein the mask is selected from the group consisting of gadolinium, cadmium, and alloys of gadolinium and cadmium.

6. The process of claim 1 wherein the step of bombarding with thermal neurons further comprises using a neutron fluence of between about $1 \times 10^{18}$ and $5 \times 10^{18}$ neutrons/cm.$^2$.

7. The process of claim 1 wherein the step of bombarding with thermal neurons further comprises providing a neutron flux of between about $10^{13}$ and $10^{14}$ neutrons/cm.$^2$sec.

8. The process of claim 1 wherein said period of time is between about 3 hours and 5 days.

9. The process of claim 1 wherein the P-type regions have a resistivity between about 40 and 150 ohm-cm.

* * * * *